(12) United States Patent
Perlow et al.

(10) Patent No.: US 8,536,949 B1
(45) Date of Patent: Sep. 17, 2013

(54) VARIABLE POWER AMPLIFIER SYSTEM

(75) Inventors: Harry W. Perlow, Tarpon Springs, FL (US); Habib Riazi, Stafford, VA (US); Walter F. Rausch, Shawnee, KS (US)

(73) Assignee: Sprint Communications Company L.P., Overland Park, KS (US)

(\*) Notice: Subject to any disclaimer, the term of this patent is extended or adjusted under 35 U.S.C. 154(b) by 40 days.

(21) Appl. No.: 12/603,797

(22) Filed: Oct. 22, 2009

(51) Int. Cl.
*H03G 3/30* (2006.01)

(52) U.S. Cl.
USPC ............................................ 330/284

(58) Field of Classification Search
USPC ................... 330/284, 310, 98, 150, 133
See application file for complete search history.

(56) References Cited

U.S. PATENT DOCUMENTS

| | | | |
|---|---|---|---|
| 5,128,629 A | 7/1992 | Trinh | |
| 5,152,004 A | 9/1992 | Vaisanen et al. | |
| 5,646,578 A * | 7/1997 | Loh et al. | 330/279 |
| 6,615,027 B1 * | 9/2003 | Sahota et al. | 455/91 |
| 6,889,033 B2 * | 5/2005 | Bongfeldt | 455/11.1 |
| 2010/0130144 A1 * | 5/2010 | Narathong et al. | 455/114.2 |

OTHER PUBLICATIONS

ANADIGICS, "AWM6423 2.5-2.7 GHz WiMAX Power Amplifier Module," Data Sheet—Rev. 2.2, Nov. 2008, pp. 1-12, Anadigics, Inc., Warren, New Jersey, U.S.A.

\* cited by examiner

*Primary Examiner* — Hieu Nguyen

(57) ABSTRACT

A fixed-gain power amplifier receives a preamplifier output signal and produces a power output signal. The preamplifier output signal is amplified by the fixed-gain power amplifier to produce the power output signal. The variable-gain preamplifier receives an input signal, a preamplifier control signal, and produces the preamplifier output signal. The input signal is amplified by a preamplifier amount of gain by the variable-gain preamplifier to produce the preamplifier output signal. The preamplifier amount of gain is based on the preamplifier control signal. A variable attenuator receives the power output signal, an attenuator control signal, and produces an output signal. The power output signal is attenuated by an attenuator amount of attenuation by the variable attenuator to produce the output signal. The attenuator amount of attenuation is based on the attenuator control signal.

17 Claims, 8 Drawing Sheets

VARIABLE POWER AMPLIFIER SYSTEM

TECHNICAL BACKGROUND

Wireless communication may be used as a means of accessing a network. Wireless communication has certain advantages over wired communications for accessing a network. One of those advantages is a lower cost of infrastructure to provide access to many separate locations or addresses compared to wired communications. This is the so-called "last mile" problem. Another advantage is mobility. Wireless communication devices, such as cell phones, are not tied by wires to a fixed location. To use wireless communication to access a network, a customer needs to have at least one transceiver in active communication with another transceiver that is connected to the network.

To facilitate wireless communications, the Institute of Electrical and Electronics Engineers (IEEE) has promulgated a number of wireless standards. These include the 802.11 (WiFi) standards and the 802.16 (WiMAX) standards. Likewise, the International Telecommunication Union (ITU) has promulgated standards to facilitate wireless communications. This includes TIA-856, which is also known as Evolution-Data Optimized (EV-DO). The European Telecommunications Standards Institute (ETSI) has also promulgated a standard known as long term evolution (LTE). Additional standards such as the fourth generation communication system (4G) are also being pursued. These standards pursue the aim of providing a comprehensive IP solution where voice, data, and streamed multimedia can be given to users on an "anytime, anywhere" basis. These standards also aim to provide higher data rates than previous generations. All of these standards may include specifications for various aspects of wireless communication with a network. These aspects include processes for registering on the network, carrier modulation, frequency bands of operation, and message formats.

Another aspect that may be addressed by these standards, or by government licensing authorities, is the radio frequency (RF) power output mobile devices and fixed stations may use to transmit. The transmit power of a mobile device may be varied from time to time according to these standards.

OVERVIEW

A controlled power amplifier system is disclosed. A fixed-gain power amplifier receives a preamplifier output signal and produces a power output signal. The preamplifier output signal is amplified by the fixed-gain power amplifier to produce the power output signal. The amount of gain the preamplifier input signal is amplified by is fixed by the gain of the fixed-gain power amplifier. The variable-gain preamplifier receives an input signal, a preamplifier control signal, and produces the preamplifier output signal. The input signal is amplified by a preamplifier amount of gain by the variable-gain preamplifier to produce the preamplifier output signal. The preamplifier amount of gain is based on the preamplifier control signal. A variable attenuator receives the power output signal, an attenuator control signal, and produces an output signal. The power output signal is attenuated by an attenuator amount of attenuation by the variable attenuator to produce the output signal. The attenuator amount of attenuation is based on the attenuator control signal.

A method of reducing noise on an amplified output signal is disclosed. An input signal is amplified by a variable-gain preamplifier. The input signal is amplified by the variable-gain preamplifier by a preamplifier amount of gain to produce a preamplifier output signal. The preamplifier amount of gain is based on a preamplifier gain control signal. The preamplifier gain control signal controls the preamplifier amount of gain to be greater than a minimum preamplifier amount of gain. A fixed-gain power amplifier receives the preamplifier output signal. The fixed-gain power amplifier produces a power output signal. A variable attenuator attenuates the power output signal by a variable attenuator amount of attenuation to produce an output signal. The variable attenuator amount of attenuation is based on a variable attenuation control signal.

A low noise RF power amplifier is disclosed. A variable-gain preamplifier receives an input signal, and a pre-amp gain control signal. The gain of the variable-gain preamplifier is controlled by the pre-amp control signal. A fixed-gain power amplifier receives a pre-amp output signal coupled from the variable-gain preamplifier. A variable attenuator receives a power amplifier output signal coupled from the fixed-gain power amplifier, and an attenuator control signal. The attenuation of the variable attenuator is controlled by the attenuator control signal. The pre-amp control signal and the variable attenuator cooperate to minimize noise on an RF power amplifier output. The noise was produced by at least one of the variable-gain preamplifier, the fixed-gain power amplifier, and the variable attenuator.

DETAILED DESCRIPTION

In an embodiment, an RF signal is amplified by a 3-stage amplifier. The 3-stages comprise a variable-gain preamplifier, a fixed-gain amplifier, and a variable attenuator. The variable-gain preamplifier may produce an output signal with a signal to noise ratio (SNR) that is dependent on gain. The fixed-gain amplifier may produce an output signal with a SNR that is dependent on an input signal level. The variable attenuator may produce an output with a SNR that is dependent on the amount of attenuation. The gain of the preamplifier and the attenuation of the attenuator are set to minimize noise and/or distortion injected by the 3-stage amplifier as a whole while producing a desired amplification of the input signal.

For example, the preamplifier may have an injected noise to amplification curve that varies inversely with gain. This curve may have several peaks and valleys. Likewise, the noise injected by the fixed-gain power amplifier may decrease with increased input signal level. This curve may also have various peaks and valleys. Finally, the attenuator may inject more noise at high attenuations than at low attenuations. This noise to attenuation curve may also have peaks and valleys. In an embodiment, the gain of the preamplifier and the attenuation of the attenuator are set to produce a desired amplification level for the 3-stage amplifier, while minimizing the noise injected (and amplified) by the 3-stages taking into account their noise to gain/signal level/attenuation curves of the 3-stages.

Figure 1:
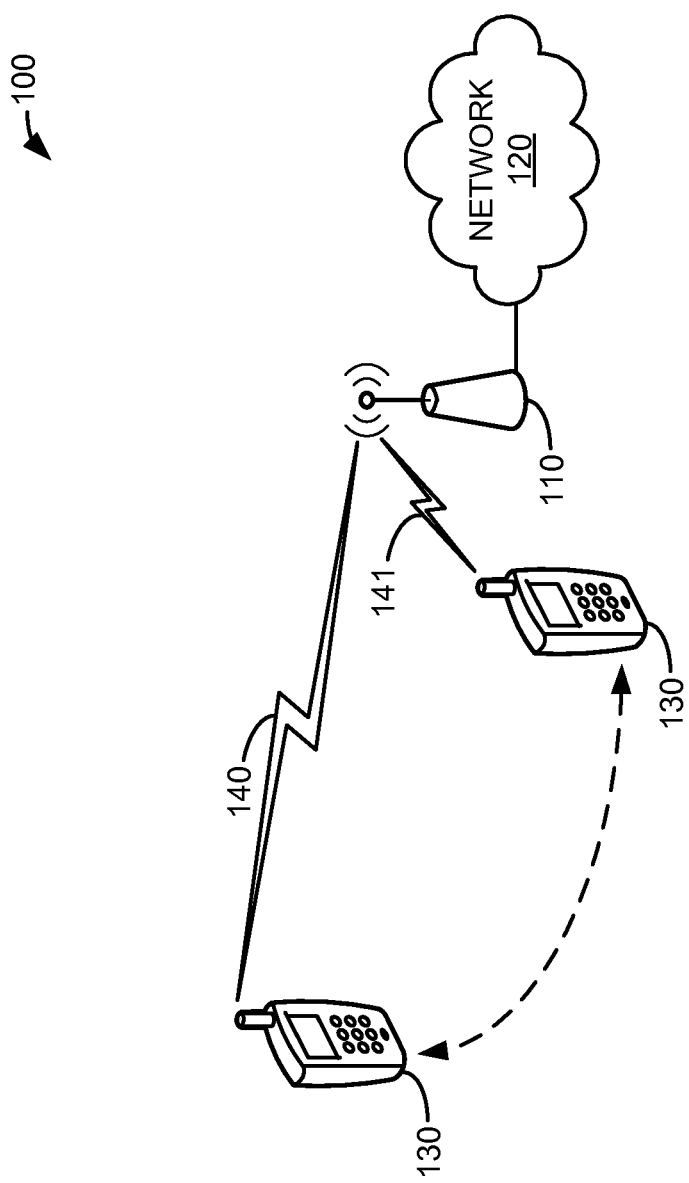
FIG. 1 is a block diagram illustrating a communication system having a mobile device with a controlled power amplifier.

FIG. 1 is a block diagram illustrating a communication system having a mobile device with a controlled power amplifier. Communication system 100 comprises base station 110, network 120, and wireless device 130. In FIG. 1, wireless device 130 is shown is two different places. Each of these places is a different distance from base station 110. Thus, at a first of these places, wireless device 130 is shown linked to base station 110 via a wireless link 140 having a first transmit power level. At a second of these places, wireless device 130 is shown linked to base station 110 via a wireless link 141 having a second transmit power level.

Wireless device 130 may be any device, system, combination of devices, or other such communication platform capable of communicating with base station 110 using variable transmit power. Wireless device 130 may use communication aspects specified by the WiMAX or CDMA specifications including, but not limited to, the variable transmit powers detailed therein. Wireless device 130 may be, or comprise, for example, a mobile phone, a wireless phone, a wireless modem, a personal digital assistant (PDA), a voice over internet protocol (VoIP) phone, a voice over packet (VOP) phone, or a soft phone, as well as other types of devices or systems that can exchange data with base station 110 via multiple transmit powers. Other types of communication platforms are possible. Wireless device 130 may include a number of elements known to those skilled in the art comprising transceivers, power amplifiers, combiner, duplexer, antennas and control function. Wireless device may also include other additional components such as a control function or control computer. However, these additional components have been omitted from the depiction of wireless device 130 in FIG. 1 for the sake of brevity.

Base station 110 may be any wireless system that provides the air interface to wireless device 130 using variable transmit power. Base station 110 may also use one or more transmitters. Base station 110 may also use one or more receivers. Base station 110 may use communication aspects specified by the WiMAX or CDMA specifications including, but not limited to, variable transmit powers detailed therein. Examples of base stations that may be utilized include, base transceiver stations (BTSs), radio base stations (RBSs), Node B, enhanced Node B (eNBs) and others. Base stations may include a number of elements known to those skilled in the art comprising transceivers, power amplifiers, combiner, duplexer, antennas and control function. Base station 110 may also include other additional components such as a control function or control computer. However, these additional components have been omitted from FIG. 1 for the sake of brevity.

Network 120 may be any network or collection of networks that couple, link, or otherwise operatively connect base station 110 with each other or other devices or systems. Network 120 may include other secondary data networks. In an example, network 120 may include a backhaul network, a local network, a long distance network, or a packet network, or any combination thereof, as well as other types of networks.

In an example, network 120 may be, or include all or parts of an IEEE 802.16 (WiMAX) specified system. These parts may include additional base stations (BSs), an access services network (ASN), access services network gateway (ASN-GW), or connectivity service network (CSN).

In an embodiment, wireless device 130 or base station 110 may vary a transmit power. In order to accomplish this, wireless device 130 or base station 110 may provide an input signal with a relatively fixed signal level to a controlled power amplifier. Wireless device 130 or base station 110 may adjust control signals provided to the controlled power amplifier to produce a desired overall gain (or output power level). Wireless device 130 or base station 110 may adjust control signals provided to the controlled power amplifier to produce a desired overall gain (or output power level) while minimizing noise injected by the controlled power amplifier. A block diagram of a controlled power amplifier suitable for use by wireless device 130 or base station 110 is illustrated in FIG. 2.

Figure 2:
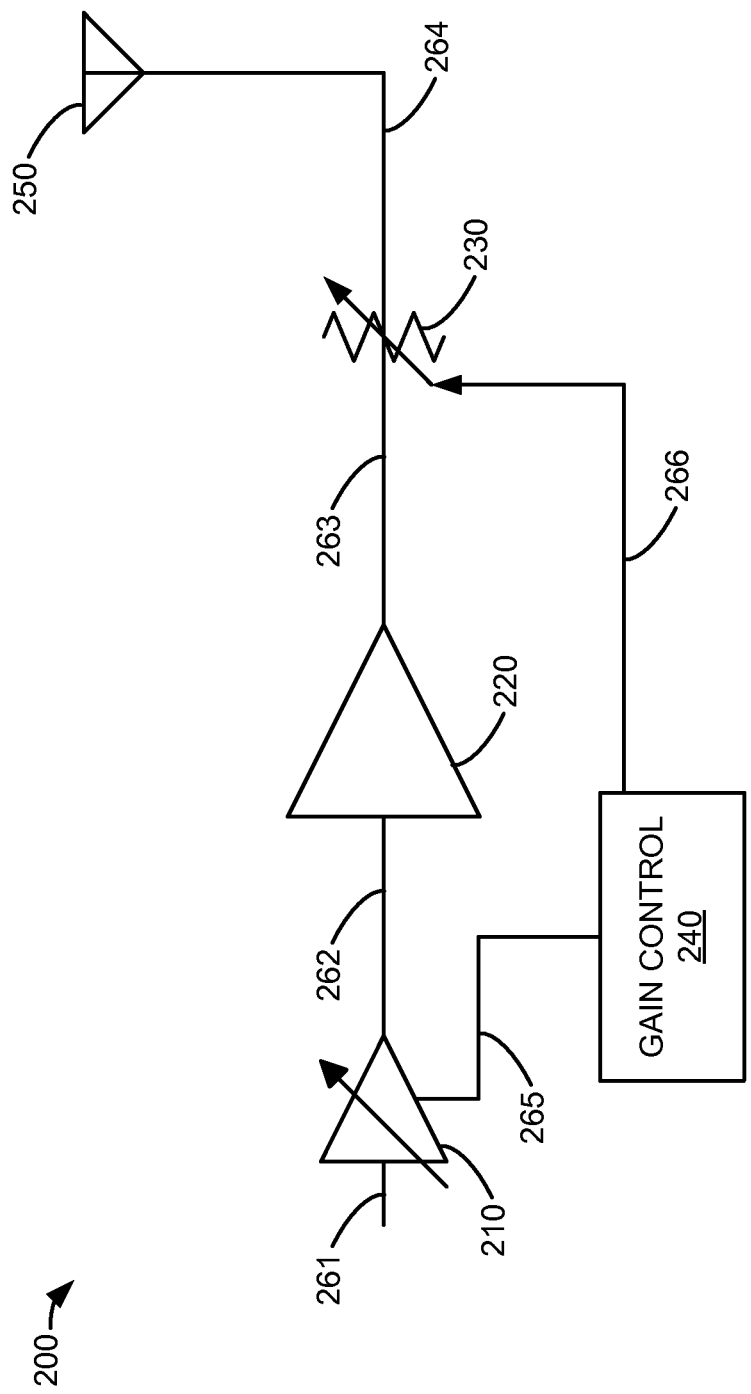
FIG. 2 is a block diagram of a controlled power amplifier.

FIG. 2 is a block diagram of a controlled power amplifier. Controlled amplifier system 200 comprises variable-gain preamplifier 210, fixed-gain amplifier 220, variable attenuator 230, gain control 240, and optionally, antenna 250. Input signal 261 is coupled to an input of preamplifier 210. Preamplifier 210 produces a preamplifier output signal 262 that is primarily an amplified version of input signal 261. The gain of preamplifier 210 is controlled by preamplifier gain control signal 265. Preamplifier output signal 262 may also contain noise injected by preamplifier 210. The amount of noise injected by preamplifier 210 may be dependent upon the amount gain of preamplifier 210 is set to produce.

Fixed-gain amplifier 220 receives preamplifier output signal 262. Fixed-gain amplifier 220 produces a power output signal 263 that is primarily an amplified version of preamplifier output signal 262. The gain of amplifier 220 is controlled by the design of amplifier 220 to be a substantially constant value. Power output signal 263 may also contain noise injected by amplifier 220. The amount of noise injected by amplifier 220 may be dependent upon the signal level of preamplifier output signal 262 at the input of amplifier 220.

Power output signal 263 is coupled to an input of variable attenuator 230. Variable attenuator 230 produces an output signal 264 that is primarily an attenuated version of power output signal 263. The attenuation of variable attenuator 230 is controlled by attenuator control signal 266. Output signal 264 may also contain noise injected by variable attenuator 230. The amount of noise injected by variable attenuator may be dependent upon the amount of attenuation variable attenuator 230 is set to produce. In an embodiment, preamplifier 210, fixed-gain amplifier 220, or attenuator 230 may be responsive to RF signals and output signal 264 may optionally be coupled to antenna 250.

In an embodiment, preamplifier gain control signal 265 may be generated by gain control block 240. Attenuator control signal 266 may be generated by gain control block 240. Gain control block 240 may set one or more of preamplifier gain control signal 265 and attenuator control signal 266 such that controlled amplifier system 200 produces a desired overall gain (or output power level). Gain control 240 may set one or more of preamplifier gain control signal 265 and attenuator control signal 266 control signals such that controlled amplifier system 200 produces a desired overall gain (or output power level) while minimizing noise injected by the controlled power amplifier system 200.

In an embodiment, preamplifier 210 may inject substantially more noise into preamplifier output signal 262 (and thus power output signal 263) when preamplifier 210 is controlled to produce less than a threshold amount of gain. For example, preamplifier 210 may produce a relatively constant SNR when controlled to amplify from a maximum level of amplification down to a threshold amount of gain. Below that threshold amount of gain, preamplifier 210 (or the combination of preamplifier 210 and amplifier 220) may produce a decreasing SNR (i.e., increasing noise level) as the gain is reduced below this gain threshold.

Figure 3:
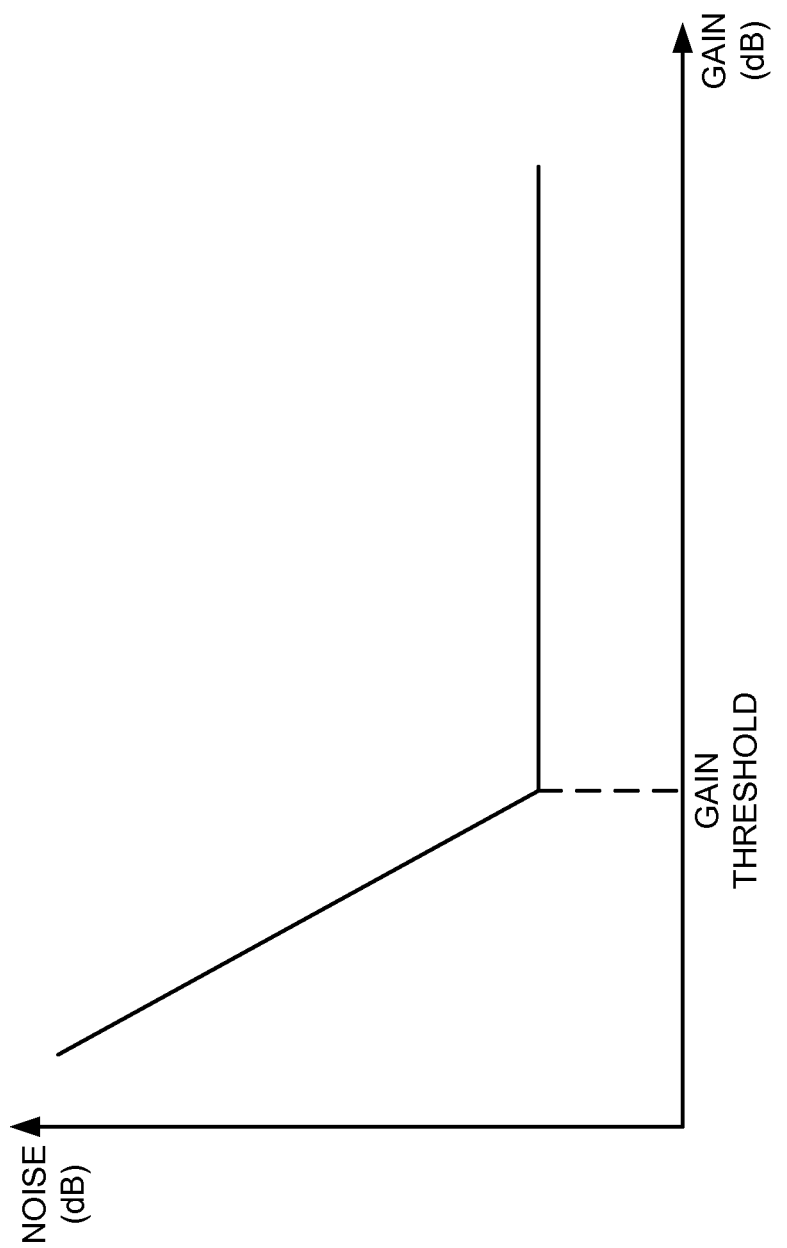
FIG. 3 is an example noise versus gain curve for an amplifier.

An example plot of noise to amplifier gain is shown in FIG. 3. This plot may illustrate the noise on preamplifier output signal 262 versus the gain of preamplifier 210. Alternatively, this plot may illustrate the noise on power output signal 263 versus the gain of preamplifier 210. The plot may illustrate absolute noise power (in dB) as well as noise to signal ratio (in –dB).

Gain control 240 may control preamplifier gain control signal 265 so that the gain of preamplifier 210 is always greater than the gain threshold. Likewise, gain control 240 may control attenuator control signal 266 so that gains below the gain threshold may be achieved while minimizing injected noise on the output signal 264.

In an embodiment, gains below the gain threshold are achieved by holding the gain of preamplifier 220 constant at a selected minimum amount of gain, and increasing the attenuation of attenuator 230 for desired gains below the gain threshold. Gains above the gain threshold are achieved by holding the attenuation of attenuator 230 constant at a minimum selected amount of attenuation, and increasing the gain of preamplifier 210 to achieve desired gains above the gain threshold. These relationships are illustrated, by way of example, in FIG. 4.

Figure 4:
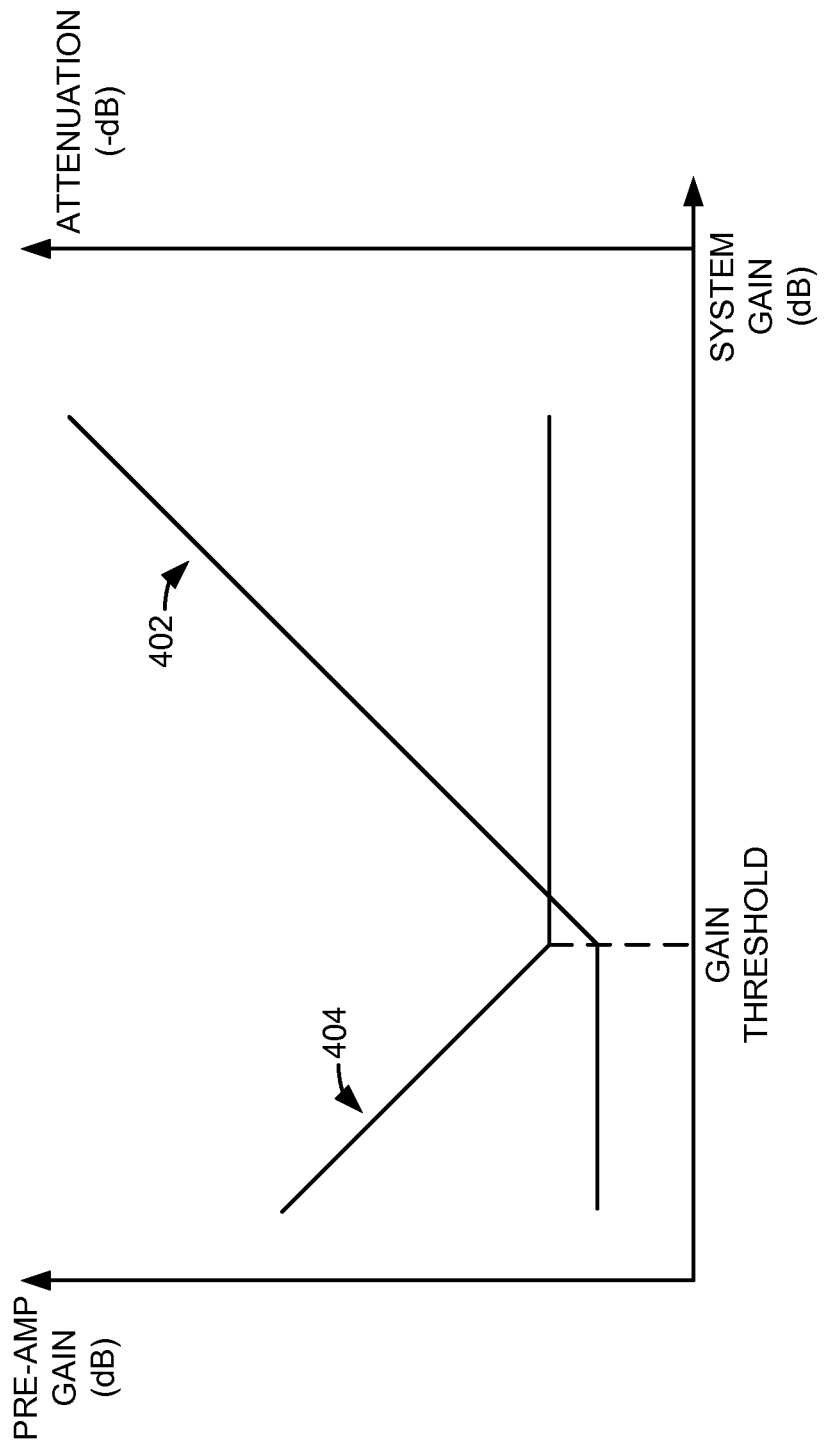
FIG. 4 are example controlled power amplifier gain versus preamplifier gain and attenuator attenuation curves.

In FIG. 4, preamplifier 210 gain curve 402 is plotted on the y-axis versus the desired system gain on the x-axis. Attenuator 230 attenuation curve 404 is plotted on the y-axis (in negative dB) versus the desired system gain. Thus, it can be seen from FIG. 4 that when a desired system gain is below a minimum value (e.g., the gain threshold), the preamplifier gain is held constant and the attenuation of attenuator 230 is increased to produce lower system gains. In an embodiment, the gain threshold may be selected to achieve a minimized or acceptable amount of noise on output 264. When a desired system gain is above the minimum value, the attenuation of attenuator 230 is held constant and the gain of preamplifier 210 is increased to produce increased system gains. In this manner, the minimized or acceptable amount of noise on output 264 may be achieved without unnecessarily dissipating power in attenuator 230.

Figure 5:
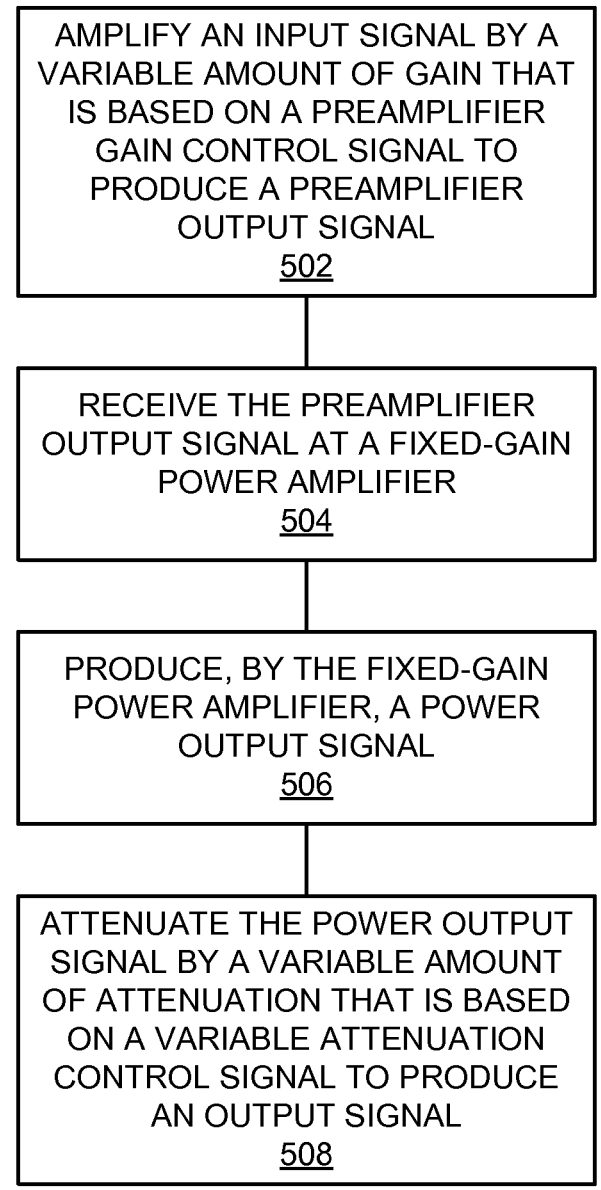
FIG. 5 is a flowchart of a method of reducing noise on an amplified output signal.

FIG. 5 is a flowchart of a method of reducing noise on an amplified output signal. The steps illustrated in FIG. 5 may be performed by one or more elements of communication system 100 or controlled amplifier system 200.

An input signal is amplified by a variable amount of gain that is based on a preamplifier gain control signal to produce a preamplifier output signal (502). For example, input signal 261 may be amplified by preamplifier 210 to produce preamplifier output signal 262. Preamplifier 210 may have a variable amount of gain that is controlled by preamplifier gain control signal 265. Preamplifier output signal 262 may be primarily an amplified version of input signal 261. Preamplifier output signal 262 may also contain noise injected by preamplifier 210. The amount of noise injected by preamplifier 210 may be dependent upon the amount gain of preamplifier 210 is set to produce.

The preamplifier output signal is received at a fixed-gain power amplifier (504). For example, preamplifier output signal 262 may be received at the input to fixed-gain amplifier 220.

The fixed-gain power amplifier produces a power output signal (506). For example, amplifier 220 may produce power output signal 263. Power output signal 263 may be primarily an amplified version of preamplifier output signal 262. The gain of amplifier 220 may be controlled by the design of amplifier 220 to be a substantially constant value. Power output signal 263 may also contain noise injected by amplifier 220. The amount of noise injected by amplifier 220 may be dependent upon the signal level of preamplifier output signal 262 at the input of amplifier 220.

The power output signal is attenuated by a variable amount of attenuation that is based on a variable attenuation control signal to produce an output signal (508). For example, attenuator 230 may attenuate power output signal 263 to produce output signal 264. Attenuator 230 may be controlled by attenuator control signal 266. Variable attenuator 230 may produce output signal 264 that is primarily an attenuated version of power output signal 263. Output signal 264 may also contain noise injected by variable attenuator 230. The amount of noise injected by variable attenuator may be dependent upon the amount of attenuation variable attenuator 230 is set to produce. Output signal 264 may be coupled to antenna 250.

Figure 6:
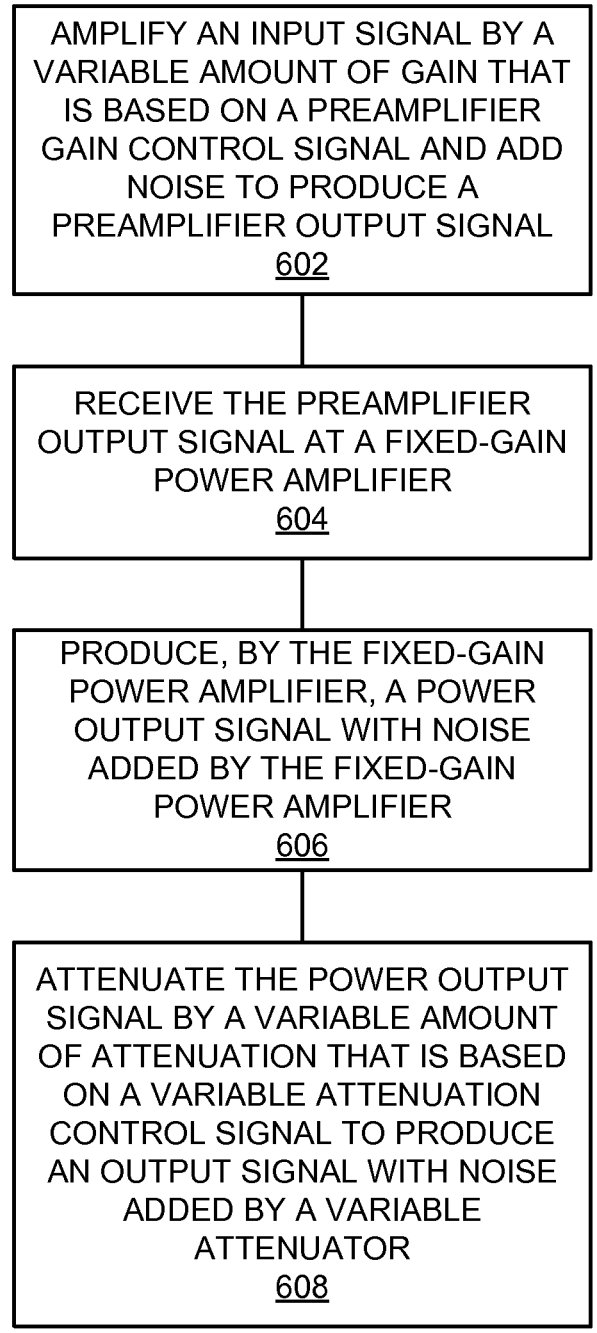
FIG. 6 is a flowchart of a method of reducing noise on an amplified output signal.

FIG. 6 is a flowchart of a method of reducing noise on an amplified output signal. The steps illustrated in FIG. 6 may be performed by one or more elements of communication system 100 or controlled amplifier system 200.

An input signal is amplified by a variable amount of gain that is based on a preamplifier gain control signal and noise is added to produce a preamplifier output signal (602). For example, input signal 261 may be amplified by preamplifier 210 and also have noise and/or distortion added to the amplified signal to produce preamplifier output signal 262. Preamplifier 210 may have a variable amount of gain that is controlled by preamplifier gain control signal 265. Preamplifier output signal 262 may be primarily an amplified version of input signal 261. The amount of noise and/or distortion caused by preamplifier 210 may be dependent upon the amount gain of preamplifier 210 is set to produce.

The preamplifier output signal is received at a fixed-gain power amplifier (604). For example, preamplifier output signal 262 may be received at the input to amplifier 220.

The fixed-gain power amplifier produces a power output signal with noise added and/or created by the fixed-gain amplifier (606). For example, fixed-gain amplifier 220 may produce power output signal 263 that is primarily an amplified version of preamplifier output signal 262 with noise and/or distortion added to it. The gain of amplifier 220 may be controlled by the design of amplifier 220 to be a substantially constant value. The amount of noise and/or distortion injected by amplifier 220 may be dependent upon the signal level of preamplifier output signal 262 at the input of amplifier 220.

The power output signal is attenuated by a variable amount of attenuation that is based on a variable attenuation control signal to produce an output signal with noise added by a variable attenuator (608). For example, attenuator 230 may attenuate power output signal 263 to produce output signal 264 that has noise added to it by attenuator 230. Attenuator 230 may be controlled by attenuator control signal 266. Attenuator 230 may produce output signal 264 that is primarily an attenuated version of power output signal 263. The amount of noise injected by attenuator 230 may be dependent upon the amount of attenuation variable attenuator 230 is set to produce. Output signal 264 may be coupled to antenna 250.

Figure 7:
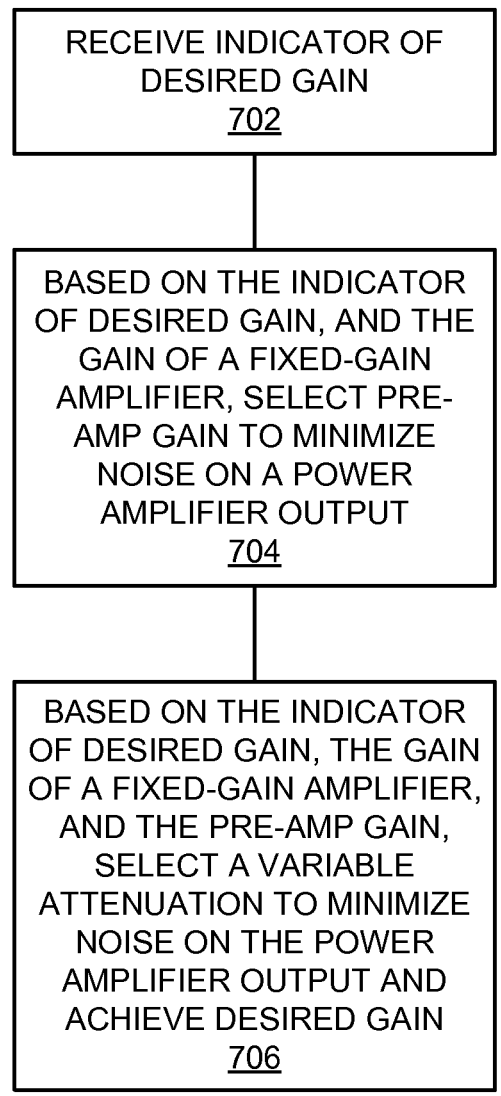
FIG. 7 is a flowchart of selecting preamplifier gain and attenuation to minimize noise on the output of a controlled power amplifier.

FIG. 7 is a flowchart of a method of reducing noise on an amplified output signal. The steps illustrated in FIG. 7 may be performed by one or more elements of communication system 100 or controlled amplifier system 200.

An indicator of desired gain is received (702). For example, gain control 240 may receive an indicator of the gain desired by wireless device 130 that controlled amplifier system 200 is to produce. This indicator of desired gain may be, for example, a digital set of signals, a number, or an analog signal.

Based on the indicator of desired gain, and the gain of a fixed-gain amplifier, a pre-amp gain is selected to minimize noise on a power amplifier output (704). For example, based on an indicator of desired gain coupled to gain control 240, and the gain of fixed-gain amplifier 220, gain control 240 may select a gain for preamplifier 210 that reduces noise and/or distortion on output signal 264. This selection may be based, for example, on the pre-amp gain versus noise plot shown in FIG. 4.

Based on the indicator of desired gain, the gain of a fixed-gain amplifier, and the pre-amp gain, a variable attenuation is selected to minimize noise on a power amplifier output and achieve the desired gain (706). For example, based on an indicator of desired gain coupled to gain control 240, the gain of fixed-gain amplifier 220, and the pre-amp gain selected in block 704, gain control 240 may select an attenuation for attenuator 230 that reduces noise and/or distortion on output signal 264 and also achieves the desired gain for controlled amplifier system 200.

In an embodiment, the gain and/or attenuation versus noise curves of preamplifier 210 and attenuator 230 may be non-linear. In this case, gain control may utilize various minimization techniques to select one or more of the gain for preamplifier 210 and the attenuation of attenuator 230. These techniques include iterative techniques, linear programming, nonlinear program, predetermined tables, predetermined formulas, or other minimization algorithms.

Figure 8:
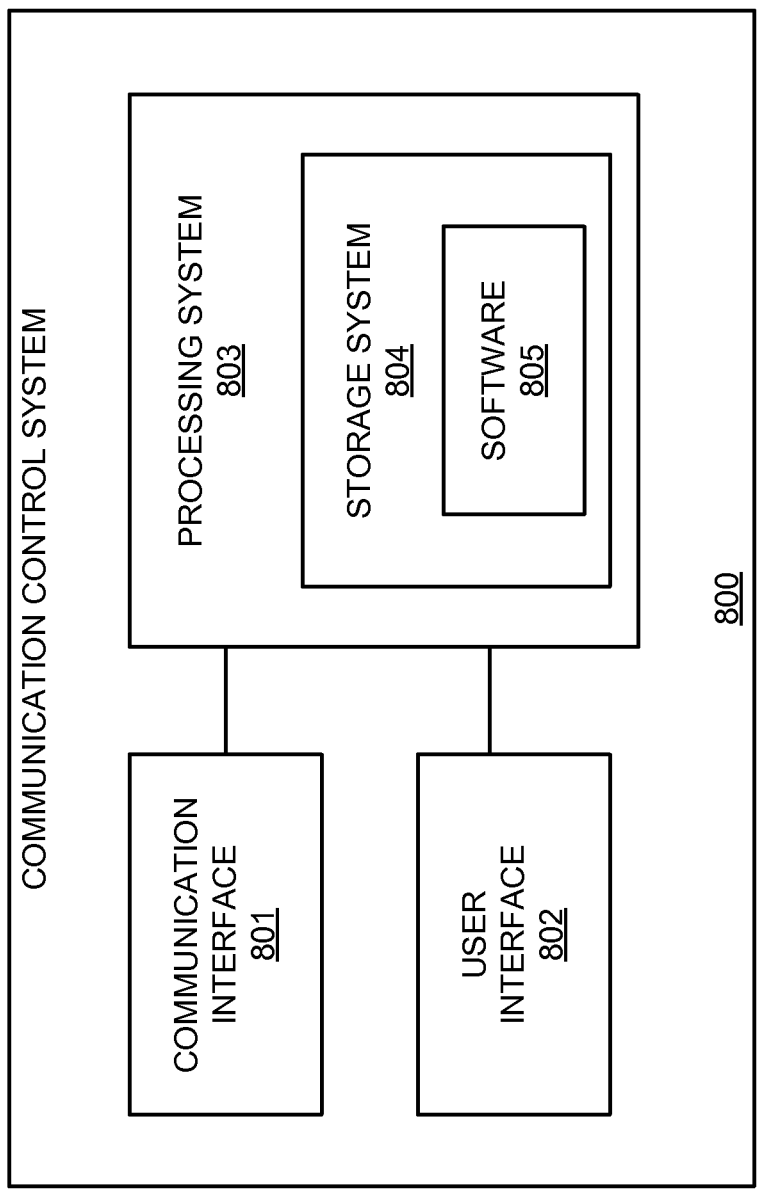
FIG. 8 is a block diagram of a communication control system.

FIG. 8 illustrates communication control system 800. Communication control system 800 is an example of components of base station 110, wireless device 130, or gain control 240 that may be used to implement the methods and algorithms described previously. Communication control system 800 comprises communication interface 801, user interface 802, and processing system 803. Processing system 803 is linked to communication interface 801 and user interface 802. Processing system 803 includes storage system 804 that stores software 805.

Communication interface 801 comprises components that communicate over communication links, such as network cards, ports, RF transceivers, processing circuitry and software, or some other communication devices. Communication interface 801 may be configured to communicate over metallic, wireless, or optical links. Communication interface 801 may be configured to use TDM, IP, Ethernet, optical networking, wireless protocols, communication signaling, or some other communication format—including combinations thereof.

User interface 802 comprises components that interact with a user. User interface 802 may include a keyboard, display screen, mouse, touch pad, or some other user input/output apparatus. User interface 802 may be omitted in some examples.

Processing system 803 may comprise a microprocessor and other circuitry that retrieves and executes software 805 from storage system 804. Storage system 804 may comprise a disk drive, flash drive, data storage circuitry, or some other memory apparatus. Software 805 comprises computer programs, firmware, or some other form of machine-readable processing instructions. Software 805 may include an operating system, utilities, drivers, network interfaces, applications, or some other type of software. When executed by processing system 803, software 805 directs processing system 803 to operate communication control system 800 as described herein.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A controlled power amplifier system, comprising:
    a fixed-gain power amplifier receiving a preamplifier output signal and producing a power output signal, the preamplifier output signal being amplified by the fixed-gain power amplifier to produce the power output signal, the amount of gain the preamplifier input signal is amplified by being fixed;
    a variable-gain preamplifier receiving an input signal, a preamplifier control signal, and producing the preamplifier output signal, the input signal being amplified by a preamplifier amount of gain by the variable-gain preamplifier to produce the preamplifier output signal, the preamplifier amount of gain being based on the preamplifier control signal;
    a variable attenuator receiving the power output signal, an attenuator control signal, and producing an output signal for transmission via an antenna coupled to the controlled power amplifier system, the power output signal being attenuated by an attenuator amount of attenuation by the variable attenuator to produce the output signal, the attenuator amount of attenuation being based on the attenuator control signal; and
    a gain control, the gain control producing the preamplifier control signal and the attenuator control signal to adjust the amount of gain for the output signal, the preamplifier control signal controlling the preamplifier amount of gain to be greater than a minimum preamplifier amount of gain, wherein the minimum preamplifier amount of gain comprises an amount of gain that results in at least a selected power amplifier output signal to noise ratio.

2. The controlled power amplifier system of claim 1, wherein the attenuator control signal controls the attenuator amount of attenuation to be greater than a minimum attenuator amount of attenuation.

3. The controlled power amplifier system of claim 1, wherein the attenuator control signal controls the attenuator amount of attenuation to be greater than a minimum attenuator amount of attenuation when the preamplifier control signal is controlling the preamplifier amount of gain to be within a gain threshold amount of the minimum preamplifier amount of gain.

4. The controlled power amplifier system of claim 1, wherein the preamplifier control signal controls the preamplifier amount of gain to be greater than the minimum preamplifier amount of gain when the attenuator control signal is controlling the attenuator amount of attenuation to be within an attenuation threshold amount of a minimum attenuator amount of attenuation.

5. The controlled power amplifier system of claim 1, wherein the preamplifier control signal and the attenuator control signal control the controlled power amplifier system to minimize a noise component on the output signal, the noise component being associated with noise generated within the fixed-gain power amplifier.

6. The controlled power amplifier system of claim 1, wherein the preamplifier control signal and the attenuator control signal control the controlled power amplifier system to minimize a noise component on the output signal, the noise component being associated with noise generated within the variable-gain preamplifier.

7. The controlled power amplifier system of claim 1, wherein the preamplifier control signal and the attenuator control signal control the controlled power amplifier system to minimize a noise component on the output signal, the noise component being associated with noise generated within the variable attenuator.

8. A method of reducing noise on an amplified output signal, comprising:
   amplifying, by a variable-gain preamplifier, an input signal, the input signal being amplified by the variable-gain preamplifier by a preamplifier amount of gain to produce a preamplifier output signal, the preamplifier amount of gain being based on a preamplifier gain control signal, the preamplifier gain control signal controlling the preamplifier amount of gain to be greater than a minimum preamplifier amount of gain, wherein the minimum preamplifier amount of gain comprises an amount of gain that results in at least a selected power amplifier output signal to noise ratio;
   receiving, by a fixed-gain power amplifier, the preamplifier output signal;
   producing, by the fixed-gain power amplifier, a power output signal;
   attenuating, by a variable attenuator, the power output signal by a variable attenuator amount of attenuation to produce an output signal for transmission via an antenna coupled to the controlled power amplifier system, the variable attenuator amount of attenuation being based on a variable attenuation control signal; and
   producing, by a gain control, the preamplifier gain control signal and the variable attenuation control signal to adjust the amount of gain for the power output signal.

9. The method of claim 8, wherein the variable attenuator control signal controls the attenuator amount of attenuation to be greater than a minimum attenuator amount of attenuation.

10. The method of claim 8, wherein the variable attenuator control signal controls the variable attenuator amount to be greater than a minimum attenuator amount of attenuation when the preamplifier gain control signal is controlling the preamplifier amount of gain to be within a gain threshold amount of the minimum preamplifier amount of gain.

11. The method of claim 8, wherein the preamplifier gain control signal controls the preamplifier amount of gain to be greater than the minimum preamplifier amount of gain when the variable attenuator control signal is controlling the amount of attenuation to be within an attenuation threshold amount of a minimum amount of attenuation.

12. The method of claim 8, wherein the preamplifier gain control signal and the variable attenuator control signal control minimize a noise component on the output signal, the noise component being associated with noise generated within the fixed-gain power amplifier.

13. The method of claim 8, wherein the preamplifier gain control signal and the variable attenuator control signal control minimize a noise component on the output signal, the noise component being associated with noise generated within the variable-gain preamplifier.

14. The method of claim 8, wherein the preamplifier gain control signal and the variable attenuator control signal control minimize a noise component on the output signal, the noise component being associated with noise generated within the variable attenuator.

15. A low noise radio frequency (RF) power amplifier, comprising:
   a variable-gain preamplifier receiving an input signal, and a pre-amp gain control signal, a gain of the variable-gain preamplifier being controlled by the pre-amp control signal;
   a fixed-gain power amplifier receiving a pre-amp output signal coupled from the variable-gain preamplifier; and,
   a variable attenuator receiving a power amplifier output signal coupled from the fixed-gain power amplifier, and an attenuator control signal, an attenuation of the variable attenuator being controlled by the attenuator control signal, the pre-amp control signal and the variable attenuator cooperating to minimize noise on an RF power amplifier output for transmission via an antenna coupled to the controlled power amplifier system, the noise was produced by at least one of the variable-gain preamplifier, the fixed-gain power amplifier, and the variable attenuator; and
   wherein the pre-amp gain control signal and the attenuator control signal are produced to adjust the amount of gain for the RF power amplifier output and the pre-amp gain control signal maintains a minimum gain of the variable-gain preamplifier that results in at least a selected power amplifier output signal to noise ratio.

16. The RF power amplifier of claim 15, wherein the attenuator control signal causes the gain of the RF power amplifier to be less than the minimum gain of the variable-gain preamplifier that results in at least the selected power amplifier output signal to noise ratio multiplied by a fixed-gain of the fixed-gain power amplifier.

17. The RF power amplifier of claim 15, further comprising:
   an RF gain control that receives an RF gain control signal and produces the pre-amp control signal and the attenuator control signal to minimize the noise on the RF power amplifier output that was produced by the at least one of the variable-gain preamplifier, the fixed-gain power amplifier, and the variable attenuator.

* * * * *